(12) United States Patent
Schor

(10) Patent No.: US 7,155,297 B2
(45) Date of Patent: Dec. 26, 2006

(54) METHOD TO CONTROL A UNIT OF A TECHNICAL APPARATUS

(75) Inventor: Stefan Schor, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 265 days.

(21) Appl. No.: 10/938,699

(22) Filed: Sep. 10, 2004

(65) Prior Publication Data
US 2005/0060047 A1 Mar. 17, 2005

(30) Foreign Application Priority Data
Sep. 11, 2003 (DE) ................................ 103 42 014

(51) Int. Cl.
*G05B 19/42* (2006.01)
(52) U.S. Cl. .............................. 700/86; 700/18; 700/83
(58) Field of Classification Search .................. 700/18, 700/86, 83, 23, 29; 707/3, 4
See application file for complete search history.

(56) References Cited

U.S. PATENT DOCUMENTS

| | | | | |
|---|---|---|---|---|
| 4,167,788 A | * | 9/1979 | Senba ............................ | 703/4 |
| 4,663,704 A | * | 5/1987 | Jones et al. .................... | 700/83 |
| 4,736,306 A | * | 4/1988 | Christensen et al. ........ | 345/420 |
| 5,168,533 A | * | 12/1992 | Kato et al. .................. | 382/229 |
| 5,359,507 A | * | 10/1994 | Egami ......................... | 700/23 |
| 5,552,707 A | | 9/1996 | Takahashi et al. | |
| 5,586,335 A | * | 12/1996 | Utan ............................ | 700/18 |
| 6,192,506 B1 | * | 2/2001 | Vishnubhatla et al. ........ | 716/4 |
| 6,246,318 B1 | | 6/2001 | Veil et al. | |
| 6,882,153 B1 | * | 4/2005 | Vavrek et al. .............. | 324/322 |

FOREIGN PATENT DOCUMENTS

| | | |
|---|---|---|
| DE | 44 30 646 A1 | 3/1995 |
| DE | 195 05 675 A1 | 8/1996 |
| DE | 197 07 241 C2 | 9/1998 |
| EP | 0 620 631 A1 | 10/1994 |
| EP | 0 727 861 A1 | 8/1996 |
| EP | 0 727 862 B1 | 10/1999 |

\* cited by examiner

*Primary Examiner*—Thomas Pham
(74) *Attorney, Agent, or Firm*—Schiff Hardin LLP

(57) ABSTRACT

A method to control a unit of a technical apparatus, where the apparatus can be operated in a plurality of operating circumstances in which the unit is controlled with a control command belonging to respective operating circumstance in order to active an operating mode associated with the operating circumstance The apparatus comprises a control unit having a program installed, this control program defining a framework comprising fundamental logical components with which information to describe the operating circumstances are prepared. A file describing the unit is present that comprises a logic unit comprising a logical expression as well as the associated control command, the logical expression defining one of the operating circumstances. The logical expression is read from the file into the control unit; a query of the logical expression identifies the operating circumstance, the logical expression defining one of the operating circumstances. The corresponding control command is subsequently output.

15 Claims, 2 Drawing Sheets

| TX / RX | 1H | 31P | — |
|---|---|---|---|
| 1H | ✕ | I | U |
| 31P | free | ✕ | free |
| — | I | free | ✕ |

METHOD TO CONTROL A UNIT OF A TECHNICAL APPARATUS

BACKGROUND OF THE INVENTION

The invention concerns a method to control a unit of a technical apparatus, whereby the apparatus can be operated in a plurality of operating circumstances in which the unit is controlled with a control command belonging to the respective operating circumstance.

The control of a unit of a technical apparatus typically ensues via a control program that is executed with the aid of a control unit. If the technical apparatus can be operated in different operating circumstances, this can have an influence on the type and manner of the control of the unit, for example, on its operating mode. If the control of the unit can be described with a few options, it is typical to permanently incorporate these into the control program. This has the disadvantage that the use of the unit via the options predetermined by the control program is severely limited. If the unit is exchanged or changed with regard to its capability, the control program must take into account new or modified properties of the unit or the operating circumstance, since this can otherwise lead to complications. For the most part, the control program must be elaborately adapted.

A further disadvantage is that the control program must from the outset take into account the entire complexity in the control of the units. The more complex the operating circumstances and the units to be controlled, the more impractical this procedure is. Furthermore, it is difficult to anticipate which future developments must be taken into account in the control program.

Such a problem results, for example, in the operation of a magnetic resonance (MR) apparatus with a plurality of attachable coil units. Depending on the type of the MR measurement (operating circumstance), specific coil units are used as transmission and/or reception antennas. For this, the coil units are connected with a control unit of the MR apparatus via a plug and a bushing that, for example, is integrated into a patient bed. The connection ensues via a plurality of channels, for example, a plurality of reception and transmission channels, a plurality of channels for the identification of the coil unit, and a plurality of channels for control of the coil unit. The coil units can be controlled in various operating modes in which, for example, one of the control channels is engaged with a voltage or with a current flow. In a third possibility, the operating mode of the coil unit is dependent on the type of the engagement of the control channel. One of the control channels can, for example, be used to tune or detune the antenna to a frequency upon transmitting or receiving radio-frequency signals.

In coil units that are suitable for transmission or reception of RF signals of a single nucleus, for example hydrogen, an operating circumstance can be described by a few options. This description is easily adopted into a control program of the MR apparatus. If a coil unit is connected with the MR apparatus, its coil data is read in that the various operating modes of the control channels are described. Depending on the operating circumstance, the corresponding control of the coil unit ensues.

This type of the control of the control channels of coil units has a disadvantage that, for example, given the use of multicore coils, the consideration of all various operating circumstances in the control program of the MR apparatus would lead to very complex program structures. Additionally, a coil unit that requires a new property of one of the operating circumstances to adjust its operating mode, this property not yet haven been taken into account in the control software, can only be used after an expansion of the control program.

From German patent document DE 197 07 241 C2, a safety switch apparatus with a notification device is known that comprises two switch states. After a detected connection of a notification device, it is checked whether the "correct" switch state is present. If this is the case, the safety switch apparatus is released.

From German patent document DE 44 30 646 A1, an RF probe for a magnetic resonance apparatus is known which comprises two coils with variable separation. An optimized compensation circuit is used dependent on the separation.

SUMMARY

The invention is based on the object to enable a complex control of a unit of a technical apparatus, this control being freely parameterizable and independent of the control program.

This object is achieved by a method to control a unit of a technical apparatus, comprising: operating the apparatus in a plurality of operating circumstances; controlling the unit with a control command of a control unit, the control command belonging to a respective operating circumstance in order to activate an operating mode associated with the operating circumstance; defining a framework with a control program installed on the control unit, said control program, the framework comprising fundamental logical components with which information to describe the operating circumstances can be prepared; providing a file describing the unit that comprises a logic unit comprising a logical expression as well as the associated control command, the logical expression defining one of the operating circumstances with at least one logical component; reading the logical expression from the file into the control unit; identifying the operating circumstance by querying the logical expression; and outputting the control command associated with the operating circumstance.

In the method, an operating circumstance is identified by querying a logical expression which defines one of the operating circumstances and is stored in a file together with a control command associated with the operating state. The unit is subsequently controlled with this control command, meaning the associated operating mode is activated.

The method according to various embodiments of the invention has the advantage that the definition of the operating circumstances ensues via a logical expression that can be created dissociated from a control program. It can, for example, be stored in a file together with the associated control command and be associated with the unit. The specification of the operating circumstance is thus no longer part of the control program.

Rather, the control program defines a framework in which information can be provided to describe the operating circumstances. The framework comprises fundamental logical components that model the elementary hardware and software conditions. The information range for generation of the logical expressions is fundamentally designed and can easily be adapted to new conditions. Logical expressions can be arbitrarily assembled within the framework and, for example, the logical components can be combined as desired.

A further advantage of the invention is that various possibilities for interaction with the technical apparatus are available dependent on the various operating circumstances. For example, individual programs can be started in order, for example, to open a window in the user interface, or further units can be selected or deselected, or special parameters can be incorporated into the operation of technical apparatus.

In a special embodiment of the method, the logical expression is read from a file describing the unit into a control unit of the technical apparatus. The development of the unit is thus separated from the control of the technical apparatus, i.e., from the control program. Known conditions for the operation can thereby already be used in the (further) development phase of the unit in order to create the associated logical expressions.

In a particular embodiment of the method, in the querying of the logical expression, a plurality of logical components are queried that are jointly linked with one or more logical operators. The logical operators can generally be formed via parameters that describe the use field, the system, or via functions that query these parameters.

In a particular embodiment of the method, a coil unit of a magnetic resonance apparatus is controlled. The control of the coil unit thereby ensues via a control channel that connects the coil unit with a control unit of the magnetic resonance apparatus and can be operated in various operating modes.

Further advantageous embodiments of the invention are described below.

DESCRIPTION OF THE DRAWINGS

The explanation of a plurality of exemplary embodiments of the invention follows using FIGS. 1 through 3.

DETAILED DESCRIPTION OF THE PREFERRED EMBODIMENTS

Figure 1:
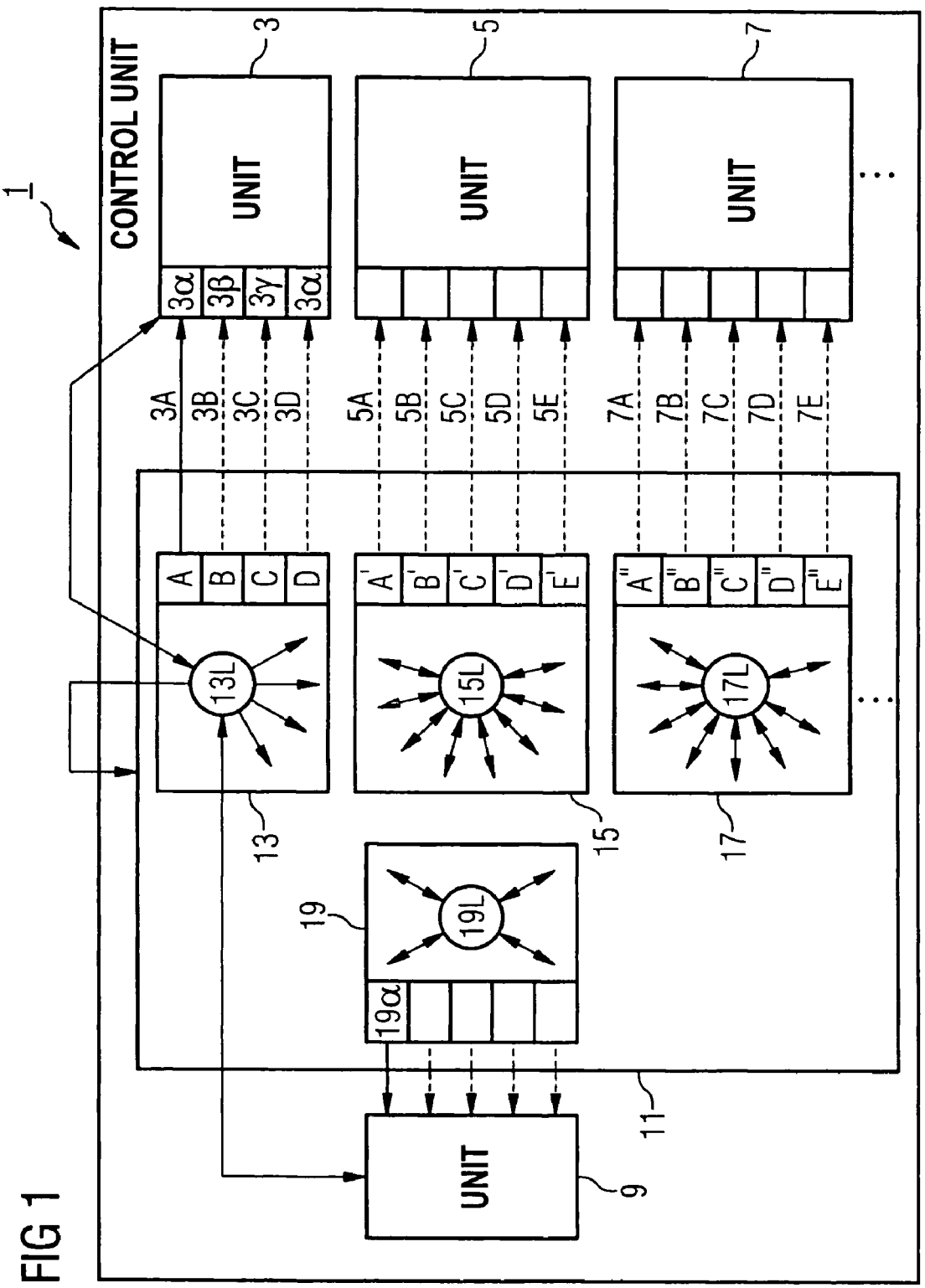
FIG. 1 is a block diagram of a technical apparatus on which the method according to the invention can be implemented.

FIG. 1 shows a technical apparatus 1 that comprises a plurality of units 3, ... 9. The units 3, ... 9 can, for example, be permanently connected with the technical apparatus or be connected to this as a module. For example, the technical apparatus 1 could correspond to a magnetic resonance apparatus and the units 3, ... 9 would, for example, be a coil unit, a base field magnet, a gradient magnet or a display unit with a user interface. The control of the units 3, ... 9 ensues via a control unit 11. Files 13, ... 19 are stored in the control unit 11 that are utilized given the use of one of the units 3, ... 9 to set the operating modes of the units 3, ... 9.

The explanation of the method should begins below with regard to the unit 3. The unit 3 can be operated in three operating modes $3\alpha$, $3\beta$, $3\gamma$. The setting of the operating mode ensues with the aid of a logic unit 13L that comprises a plurality of logical expressions with which an operating case A, ... D is respectively associated.

If, for example, the unit 3 is now connected with the technical apparatus 1, the control unit 111 reads the file 13 that contains this information and implements a query of the logical expressions. The query can, for example, concern parameters of the unit 3 or of the other units 5, ... 9, or it can concern parameters that have been set by the control unit 11, or it can query further parameters, properties, criteria etc. of the technical apparatus 1 that define the operating circumstance in view of the use of the unit 3. The queries are schematically indicated by the arrows in FIG. 1 that are arranged around the logic unit 13L.

If the result of the query of a logical expression is "true", this means that the associated operating circumstance exists. In FIG. 1, for example, the operating circumstance A (solid arrow) exists. A corresponding control command 3A effects that the unit 3 is operating in the operating mode $3\alpha$. Analogously, the operating circumstances B or C could be present that trigger the control commands 3B or 3C and correspondingly set the operating modes $3\beta$ or $3\gamma$. In FIG. 1, the operating circumstance D is in turn associated with the control command 3A that effects the operating mode $3\alpha$ of the unit 3.

In a similar manner, the operating circumstances A', ... E' for the control of the unit 5 or the operating circumstances A", ... E" for the control of the unit 7 can be set with the aid of logical expressions of the corresponding logic units 15L or 17L. The same is true for the unit 9 that, for example, is used as a user interface to control the control unit 11. If, for example, the three units 3, 5 and 7 are used with the technical apparatus 1, with the aid of the logic unit 19L the associated operating circumstance $19\alpha$ can be identified, whereupon a control command can be output that, for example, opens a control window on a display of the unit 9 for every unit.

Figures 2, 3:
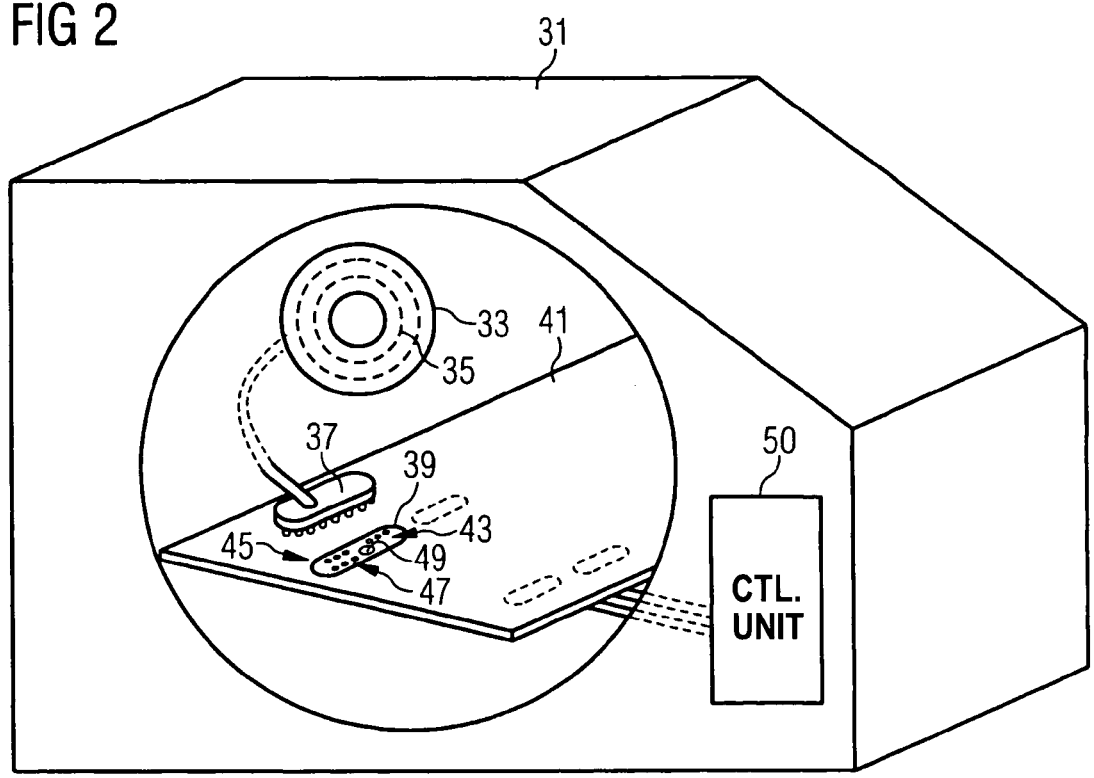
FIG. 2 is a pictorial diagram of a magnetic resonance apparatus illustrating components utilized by the method.
FIG. 3 is a requirement table of a multicore coil unit of an MR apparatus.

FIG. 2 clarifies the method using an MR apparatus 31. For an MR measurement, a coil unit 33 with a multicore coil 35 is used. The coil unit 33 can be a transmission and/or reception coil, a local coil (for example, a body or spinal column coil) or a permanently integrated coil (for example, a whole-body coil). Additionally, the plug 37 of the coil unit 33 is plugged into a bushing 39 of the patient bed 41. Reception channels 43, identification channels 45, control channels 47, as well as a transmission channel 49 between a control unit 50 of the MR apparatus 31 and the coil unit 33 are thereby produced.

Each control channel 47 can be used in one of two operating modes but this is not necessary. The operating modes depend on the respective MR measurement to be implemented. For example, a voltage can be applied to one of the control channels (operating mode U) or a current can flow through it (operating mode I). In the case that the control channel is not necessary in the MR measurement, it can be operating in the operating mode U or I. This is designated in the following as operating mode "free". For the most part, the operating mode free is replaced by the operating mode U.

FIG. 3 shows a requirement table for a multicore coil unit with such operating modes. The multicore coil can transmit and/or receive in the hydrogen mode (1H) and in the phosphorus mode (31P). The operating circumstances can be generally determined by parameters that describe the use environment, the system and/or the MR measurement. In the case of the multicore coil, for example, the possible combinations of transmission and reception with the same or different cores form the operating circumstances. Depending on the operating circumstance, a corresponding operating mode is associated with each of the control channels.

In the following, among other things, the aspect of the specification of operating circumstance is explained in detail with logical expressions. Hardware properties of the coil units are preferably modeled in coil files. The coil units can be flexibly controlled by a control program of the MR apparatus by way of such models. Such coil files are preferably ASCII-based text files that are read by the control programs and, for example, are protected with a checksum.

The rules for control of the control signals of the coil plug ("PIN diode control") may be described in the method via logical expressions in the coil file. They are, for example, assembled as a logical unit in the coil file. The associated operating mode is stated (U, I or free) for each logical expression. If one of the logical expressions is true for a coil unit, more precisely for a channel (PIN) of the coil unit, the specified operating mode is selected. Due to the possibility of defining one or more logical expressions for each control signal to be activated, the PIN diode control achieves flexibility and is easily expandable and maintainable.

The syntactic design of the logical expressions is based on constants (for example, "TRUE", "FALSE"), functions (for example, a query as to whether it is immediately sent) and logical operators (AND, OR, NOT). Each logical expression can assume one of the two values "TRUE" or "FALSE". The values of assembled logical expressions result corresponding to the semantics from the propositional logic, for example, according to a standard truth table.

Three possible types of functions form the basis of the use of coil units with an MR apparatus.
  A) Functions to detect whether a coil unit is plugged in.
  B) Functions to detect whether a coil unit is selected.
  C) Functions that refer to the transmission and reception with cores.

The evaluation of the PIN diode control occurs channel for channel, meaning the corresponding logical expressions from the coil files are evaluated in succession for each channel that connects the coil unit with a control unit. As soon as an expression is fulfilled, i.e., returns "TRUE", the corresponding operating mode is selected. This evaluation is implemented for each channel for the transmitting and receiving phase. For each coil unit, it is advantageous to store (at least) one logical expression that yields "TRUE" in order to ensure a correct functionality of the PIN diode control. For example, the constant "TRUE" is used as such as a last logical expression and a corresponding mode is associated with it.

The following provides an example for two logical expressions of a logic unit.
  Expression_0="Body coil is selected." OR "It is transmitted."
  Operating mode_0="I"
  Expression_1="TRUE"
  Operating mode_1="U"

In the first logical expression, the functions "body coil_selected" and "is transmitted" that are linked with one another via an "OR" are used as logical components. It at least one of the two cases, the operating mode "I" is set. If neither the one nor the other is the case, Expression_0 does not apply ("FALSE") and Expression_1 is queried. Since the constant "TRUE" is "TRUE", the operating mode "U" of the channel is set with a control command.

For the purposes of promoting an understanding of the principles of the invention, reference has been made to the preferred embodiments illustrated in the drawings, and specific language has been used to describe these embodiments. However, no limitation of the scope of the invention is intended by this specific language, and the invention should be construed to encompass all embodiments that would normally occur to one of ordinary skill in the art.

The present invention may be described in terms of functional block components and various processing steps. Such functional blocks may be realized by any number of hardware and/or software components configured to perform the specified functions. For example, the present invention may employ various integrated circuit components, e.g., memory elements, processing elements, logic elements, look-up tables, and the like, which may carry out a variety of functions under the control of one or more microprocessors or other control devices. Similarly, where the elements of the present invention are implemented using software programming or software elements the invention may be implemented with any programming or scripting language such as C, C++, Java, assembler, or the like, with the various algorithms being implemented with any combination of data structures, objects, processes, routines or other programming elements. Furthermore, the present invention could employ any number of conventional techniques for electronics configuration, signal processing and/or control, data processing and the like.

The particular implementations shown and described herein are illustrative examples of the invention and are not intended to otherwise limit the scope of the invention in any way. For the sake of brevity, conventional electronics, control systems, software development and other functional aspects of the systems (and components of the individual operating components of the systems) may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device. Moreover, no item or component is essential to the practice of the invention unless the element is specifically described as "essential" or "critical". Numerous modifications and adaptations will be readily apparent to those skilled in this art without departing from the spirit and scope of the present invention.

REFERENCE LIST

| | |
|---|---|
| 1 | technical apparatus |
| 3, . . . 9 | units |
| 11 | control unit |
| 13, . . . 19 | files |
| 3α, 3β, 3γ | operating mode |
| 13L, . . . 19L | logic |
| A, . . . D; A', . . . E'; A", . . . E" | } operating circumstance |
| 3A, . . . 3C; 5A, . . . 5E; 7A, . . . 7E | } control command |
| 19a | operating circumstance |
| 31 | MR apparatus |
| 33 | coil unit |
| 35 | multicore coil |
| 37 | plug |
| 39 | bushing |
| 41 | patient bed |
| 43 | reception channel |
| 45 | identification channel |
| 47 | control channel |
| 49 | transmission channel |
| 50 | control unit |
| 1H | hydrogen mode |
| 31P | phosphorus mode |
| U | operating mode U |
| I | operating mode I |
| free | operating mode free |

What is claimed is:

1. A method to control a unit of a technical apparatus, comprising:
   operating the apparatus in a plurality of operating circumstances;
   controlling the unit with a control command of a control unit, the control command belonging to a respective operating circumstance in order to activate an operating mode associated with the operating circumstance;
   defining a framework with a control program installed on the control unit, said control program, the framework comprising fundamental logical components with which information to describe the operating circumstances can be prepared;
   providing a file describing the unit that comprises a logic unit comprising a logical expression as well as the associated control command, the logical expression defining one of the operating circumstances with at least one logical component;
   reading the logical expression from the file into the control unit;
   identifying the operating circumstance by querying the logical expression; and
   outputting the control command associated with the operating circumstance.

2. The method according to claim 1, further comprising:
   querying, by the control unit, the logical expression via connections to various components of the technical apparatus.

3. The method according to claim 1, further comprising:
   querying, by the control unit, the logical expression with regard to the operating circumstance of the technical apparatus using stored information.

4. The method according to claim 1, further comprising, with each selection of the operating circumstance of the technical apparatus:
   identifying the operating circumstance; and
   outputting the associated control command.

5. The method according to claim 1, further comprising:
   triggering and event to detect the unit by the connection of the unit with the technical apparatus.

6. The method according to claim 1, further comprising:
   querying one or more logical components in the query of the logical expression.

7. The method according to claim 1, further comprising:
   mutually linking a plurality of logical components with one or more logic operators.

8. The method according to claim 1, further comprising:
   querying features of one of the operating circumstances with the logical expression.

9. The method according to claim 1, further comprising:
   querying a setting of a unit of the technical apparatus with the logical expression.

10. The method according to claim 1, further comprising:
    querying a feature of a unit of the technical apparatus with the logical expression.

11. The method according to claim 1, further comprising:
    controlling a coil unit of a magnetic resonance apparatus.

12. The method according to claim 11, further comprising:
    controlling the coil unit via a control channel that connects the coil unit with a control unit of the magnetic resonance apparatus; and
    operating the coil unit in various operating modes.

13. The method according to claim 12, further comprising:
    applying a voltage to the control channel in one of the operating modes of the coil unit.

14. The method according to claim 12, further comprising:
    applying a current flow to the control channel in one of the operating modes of the coil unit.

15. The method according to claim 12, wherein one of the operating modes of the coil unit is independent of a type of the engagement of the control channel.

* * * * *